United States Patent
Hocker

(10) Patent No.: US 11,937,395 B2
(45) Date of Patent: Mar. 19, 2024

(54) APPARATUS, SYSTEM, AND METHOD FOR SUPPORTING FIELD-REPLACEABLE UNITS IN TELECOMMUNICATIONS DEVICES VIA RETRACTABLE GUIDE RAILS

(71) Applicant: Juniper Networks, Inc., Sunnyvale, CA (US)

(72) Inventor: Keith Jeffrey Hocker, Sunnyvale, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 17/461,200

(22) Filed: Aug. 30, 2021

(65) Prior Publication Data
US 2023/0063468 A1   Mar. 2, 2023

(51) Int. Cl.
*H05K 7/14* (2006.01)
*H05K 7/18* (2006.01)

(52) U.S. Cl.
CPC .......... *H05K 7/186* (2013.01); *H05K 7/1408* (2013.01); *H05K 7/1489* (2013.01); *H05K 7/1411* (2013.01)

(58) Field of Classification Search
CPC .... H05K 7/186; H05K 7/1408; H05K 7/1489; H05K 7/183; H05K 7/1411; A47B 88/43; A47B 88/57
See application file for complete search history.

(56) References Cited

U.S. PATENT DOCUMENTS

| | | | | |
|---|---|---|---|---|
| 4,998,828 A | * | 3/1991 | Hobbs | A47B 88/493 312/334.46 |
| 6,209,979 B1 | * | 4/2001 | Fall | H05K 7/1489 312/319.1 |
| 6,654,240 B1 | * | 11/2003 | Tseng | G06F 1/184 361/679.33 |
| 6,764,149 B2 | * | 7/2004 | Jurja | A47B 88/57 312/334.46 |
| 6,926,377 B2 | * | 8/2005 | Lammens | A47B 88/49 312/334.46 |
| 7,006,351 B2 | * | 2/2006 | Chen | G06F 1/187 361/725 |
| 7,008,030 B2 | * | 3/2006 | Yang | A47B 88/40 312/334.44 |
| 7,327,565 B2 | * | 2/2008 | Chen | G11B 33/128 |
| 7,611,100 B2 | * | 11/2009 | Peng | G11B 33/124 361/679.02 |
| 10,563,429 B1 | * | 2/2020 | Bailey | E05B 35/008 |

(Continued)

*Primary Examiner* — Kimberley S Wright
(74) *Attorney, Agent, or Firm* — Greenberg Traurig, LLP

(57) ABSTRACT

A disclosed apparatus may include (1) a retractable guide rail movably coupled to a chassis, wherein the retractable guide rail is configured to support a field-replaceable unit when the field-replaceable unit is installed in the chassis, (2) a support bracket coupled to the chassis and aligned with the retractable guide rail within the chassis and (3) a locking bracket movably coupled to the support bracket, wherein the locking bracket is configured to (A) engage the retractable guide rail in an expanded position within the chassis when the field-replaceable unit is not installed in the chassis and (B) disengage the retractable guide rail such that the retractable guide rail moves to a retracted position when the field-replaceable unit is installed in the chassis. Various other apparatuses, systems, and methods are also disclosed.

16 Claims, 11 Drawing Sheets

(56) References Cited

U.S. PATENT DOCUMENTS

| | | | |
|---|---|---|---|
| 11,340,666 B2* | 5/2022 | Chen | G06F 1/187 |
| 11,419,229 B1* | 8/2022 | An | H05K 7/1489 |
| 2002/0113533 A1* | 8/2002 | Devine | A47B 88/57 |
| | | | 312/334.46 |
| 2004/0130249 A1 | 7/2004 | Judge et al. | |
| 2005/0063152 A1* | 3/2005 | Chen | G06F 1/187 |
| | | | 361/679.34 |
| 2005/0068745 A1* | 3/2005 | Hartman | H05K 7/16 |
| | | | 361/726 |
| 2005/0116135 A1* | 6/2005 | Peng | G11B 33/124 |
| 2005/0121581 A1* | 6/2005 | Chen | G06F 1/187 |
| 2005/0195564 A1* | 9/2005 | Peng | G06F 1/187 |
| | | | 361/679.01 |
| 2007/0235625 A1* | 10/2007 | Liang | G06F 1/187 |
| 2010/0033926 A1* | 2/2010 | Du | A47B 88/49 |
| | | | 361/679.58 |
| 2011/0100935 A1* | 5/2011 | Yang | H05K 7/1489 |
| | | | 211/26 |
| 2012/0013235 A1* | 1/2012 | Hisamatsu | A47B 88/43 |
| | | | 312/334.7 |
| 2012/0091075 A1* | 4/2012 | Chapel | H05K 7/1489 |
| | | | 211/26 |
| 2016/0150666 A1* | 5/2016 | Han | G06F 1/187 |
| | | | 312/321.5 |
| 2016/0150668 A1* | 5/2016 | Cheng | H05K 7/1489 |
| | | | 361/679.02 |
| 2016/0227666 A1* | 8/2016 | Chen | H05K 7/1489 |
| 2017/0099946 A1* | 4/2017 | Chen | H05K 7/1489 |
| 2018/0014644 A1* | 1/2018 | Chen | A47B 88/49 |
| 2021/0153650 A1* | 5/2021 | Chen | A47B 88/473 |
| 2022/0050509 A1* | 2/2022 | Chen | G11B 33/128 |

* cited by examiner

APPARATUS, SYSTEM, AND METHOD FOR SUPPORTING FIELD-REPLACEABLE UNITS IN TELECOMMUNICATIONS DEVICES VIA RETRACTABLE GUIDE RAILS

BACKGROUND

Field-Replaceable Units (FRUs), such as line cards, are often heavy and/or unwieldy due at least in part to their size, dimensions, density, and/or components. As a result, administrators and/or technicians may have difficulty installing or uninstalling FRUs to or from telecommunications devices (such as router racks and/or chassis).

Moreover, recent performance demands and/or advances have led manufacturers and/or vendors to shorten the support channels of FRUs to accommodate additional electronics and/or components. Unfortunately, the shortening of these support channels may have further complicated the installation and uninstallation processes for administrators and/or technicians, as aligning the shortened support channels with corresponding guide rails in telecommunications devices and/or assuming the weight of the FRUs from telecommunications devices has placed an even greater physical burden on administrators and/or technicians.

The instant disclosure, therefore, identifies and addresses a need for additional and improved apparatuses, systems, and methods for supporting FRUs in telecommunications devices via retractable guide rails.

SUMMARY

As will be described in greater detail below, the instant disclosure generally relates to apparatuses, systems, and methods for supporting FRUs in telecommunications devices via retractable guide rails. In one example, an apparatus for accomplishing such a task may include (1) a retractable guide rail movably coupled to a chassis, wherein the retractable guide rail is configured to support an FRU when the FRU is installed in the chassis, (2) a support bracket coupled to the chassis and aligned with the retractable guide rail within the chassis, and (3) a locking bracket movably coupled to the support bracket, wherein the locking bracket is configured to (A) engage the retractable guide rail in an expanded position within the chassis when the FRU is not installed in the chassis and (B) disengage the retractable guide rail such that the retractable guide rail moves to a retracted position when the FRU is installed in the chassis.

Similarly, a system for accomplishing such a task may include (1) a chassis, (2) a retractable guide rail movably coupled to the chassis, wherein the retractable guide rail is configured to support an FRU when the FRU is installed in the chassis, (3) a support bracket coupled to the chassis and aligned with the retractable guide rail within the chassis, and (4) a locking bracket movably coupled to the support bracket, wherein the locking bracket is configured to (A) engage the retractable guide rail in an expanded position within the chassis when the FRU is not installed in the chassis and (B) disengage the retractable guide rail such that the retractable guide rail moves to a retracted position within the chassis when the FRU is installed in the chassis.

A corresponding method may include (1) movably coupling a retractable guide rail to a chassis of a telecommunications device such that the retractable guide rail is configured to support an FRU when the FRU is installed in the chassis, (2) coupling a support bracket to the chassis such that the support bracket aligns with the retractable guide rail within the chassis of the telecommunications device, and (3) movably coupling the locking bracket to the support bracket such that the locking bracket is configured to (A) engage the retractable guide rail in an expanded position within the chassis when the FRU is not installed in the chassis and (B) disengage the retractable guide rail such that the retractable guide rail moves to a retracted position within the chassis when the FRU is installed in the chassis.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
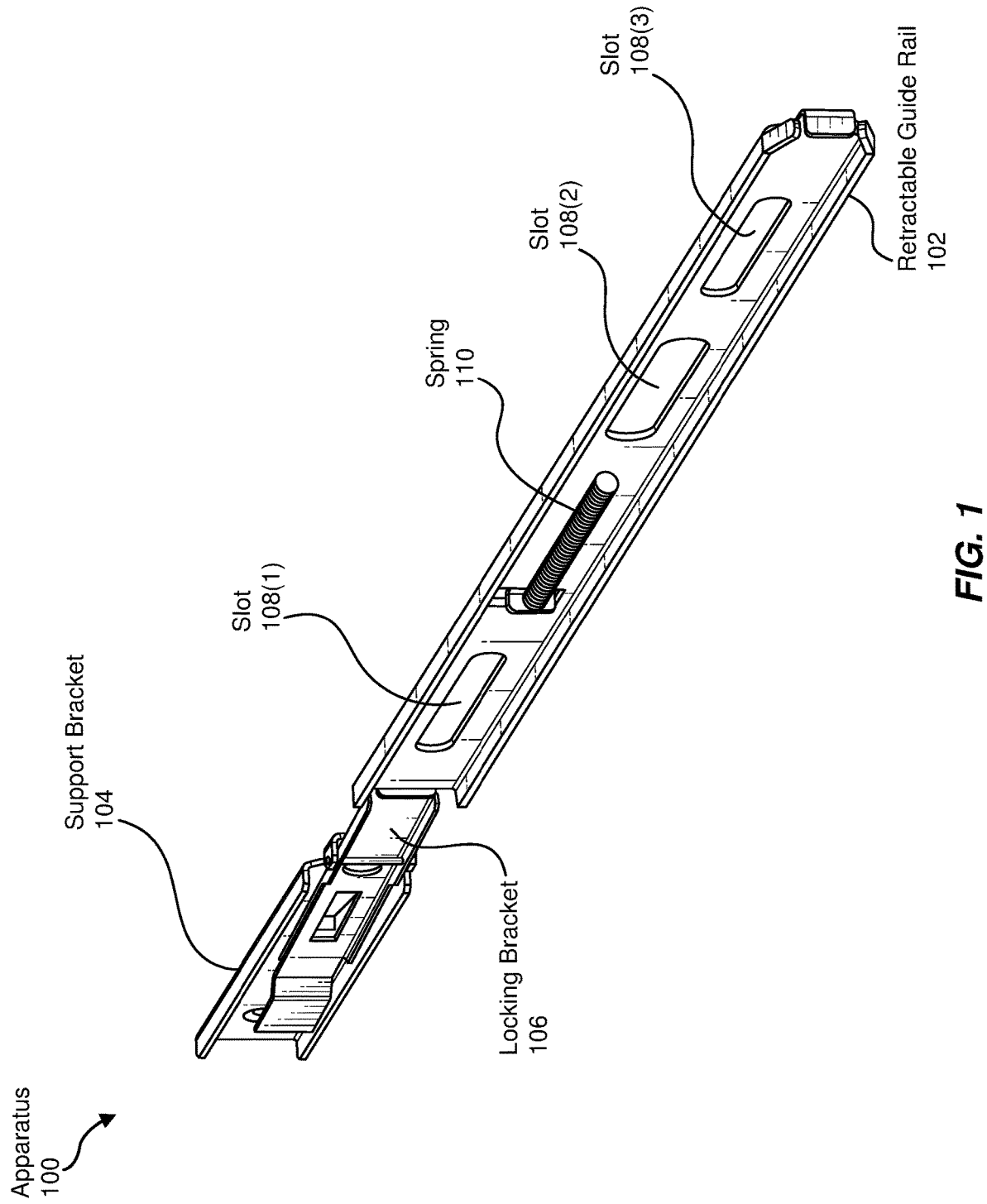
FIG. 1 is an illustration of an exemplary apparatus for supporting FRUs in telecommunications devices via retractable guide rails in accordance with one or more embodiments of this disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for supporting FRUs in telecommunications devices via retractable guide rails. As will be explained in greater detail below, embodiments of the instant disclosure may include and/or involve a retractable guide rail, a support bracket, and/or a locking bracket collectively configured within a chassis such that the locking bracket (1) engages the retractable guide rail in an expanded position when an FRU is not installed and/or (2) disengages the retractable guide rail to facilitate moving the retractable guide rail to a retracted position when an FRU is installed. Such a configuration of the retractable guide rail, the support bracket, and/or the locking bracket may help an administrator and/or technician install and/or uninstall FRUs within the chassis of a telecommunications device by easing and/or alleviating his or her physical burden (e.g., when aligning the shortened support channels on FRU side panels during installation and/or when assuring the weight of the FRUs during uninstallation).

The following will provide, with reference to FIGS. 1-10, detailed descriptions of exemplary components, apparatuses, systems, configurations, and/or implementations for supporting FRUs in telecommunications devices via retractable guide rails. In addition, the discussion corresponding to FIG. 11 will provide detailed descriptions of an exemplary method for assembling and/or manufacturing apparatuses for supporting FRUs in telecommunications devices via retractable guide rails.

FIGS. 1-5 illustrate an exemplary apparatus 100 for supporting an FRU in a telecommunications device. As illustrated in FIG. 1-5, exemplary apparatus 100 may include and/or represent a retractable guide rail 102, a support bracket 104, and a locking bracket 106. In some examples, retractable guide rail 102 may be movably coupled to a chassis (not necessarily illustrated in FIGS. 1-5). In these examples, support bracket 104 may be fixably coupled to the chassis and/or aligned with retractable guide rail 102 within the chassis. In one example, locking bracket 106 may be movably coupled to support bracket 104. In this example, locking bracket 106 may be configured, assembled, and/or designed to engage retractable guide rail 102 in an expanded position within the chassis when an FRU is not installed in the corresponding slot of the chassis. Additionally or alternatively, locking bracket 106 may be configured, assembled, and/or designed to disengage retractable guide rail 102 such that retractable guide rail 102 moves and/or returns to a retracted position when an FRU is installed in the corresponding slot of the chassis.

As illustrated in FIG. 1-5, retractable guide rail 102 may include and/or form one or more slots, such as slots 108(1), 108(2), and/or 108(3). In some examples slots 108(1)-(3) may accommodate standoffs that attach to the chassis and/or enable retractable guide rail 102 to move back and forth between the expanded and retracted positions across a section of the chassis. In such examples, slots 108(1)-(3) may define the distance and/or length that retractable guide rail 102 is able to move between the expanded and retraced positions. Additionally or alternatively, the standoffs may pass through slots 108(1)-(3) to movably couple retractable guide rail 102 to the chassis. These standoffs may provide stability and/or support to retractable guide rail 102 while also enabling retractable guide rail 102 to loosely move back and forth between the expanded and retracted positions. Accordingly, these standoffs may offer a slight spatial buffer for movement of retractable guide rail 102.

In some examples, apparatus 100 may include and/or incorporate a spring 110 coupled between retractable guide rail 102 and the chassis or an extension of the chassis (such as a standoff, screw, pin, etc.). In such examples, spring 110 may be configured, applied, and/or designed to move and/or return retractable guide rail 102 to the expanded position when an FRU is not installed in the corresponding slot of the chassis. In other words, spring 110 may apply, impart, and/or transmit a force that causes retractable guide rail 102 to move or return to the expanded position when an FRU is not installed in the corresponding slot of the chassis. Accordingly, retractable guide rail 102 may be spring-loaded.

Retractable guide rail 102, support bracket 104, and/or locking bracket 106 may each be sized in any way to fit within a designated area of the chassis and/or to interface with or support a certain FRU. Additionally or alternatively, retractable guide rail 102, support bracket 104, and/or locking bracket 106 may each include and/or contain any of a variety of materials (e.g., metals) to support and/or sustain a certain FRU.

Figure 2:
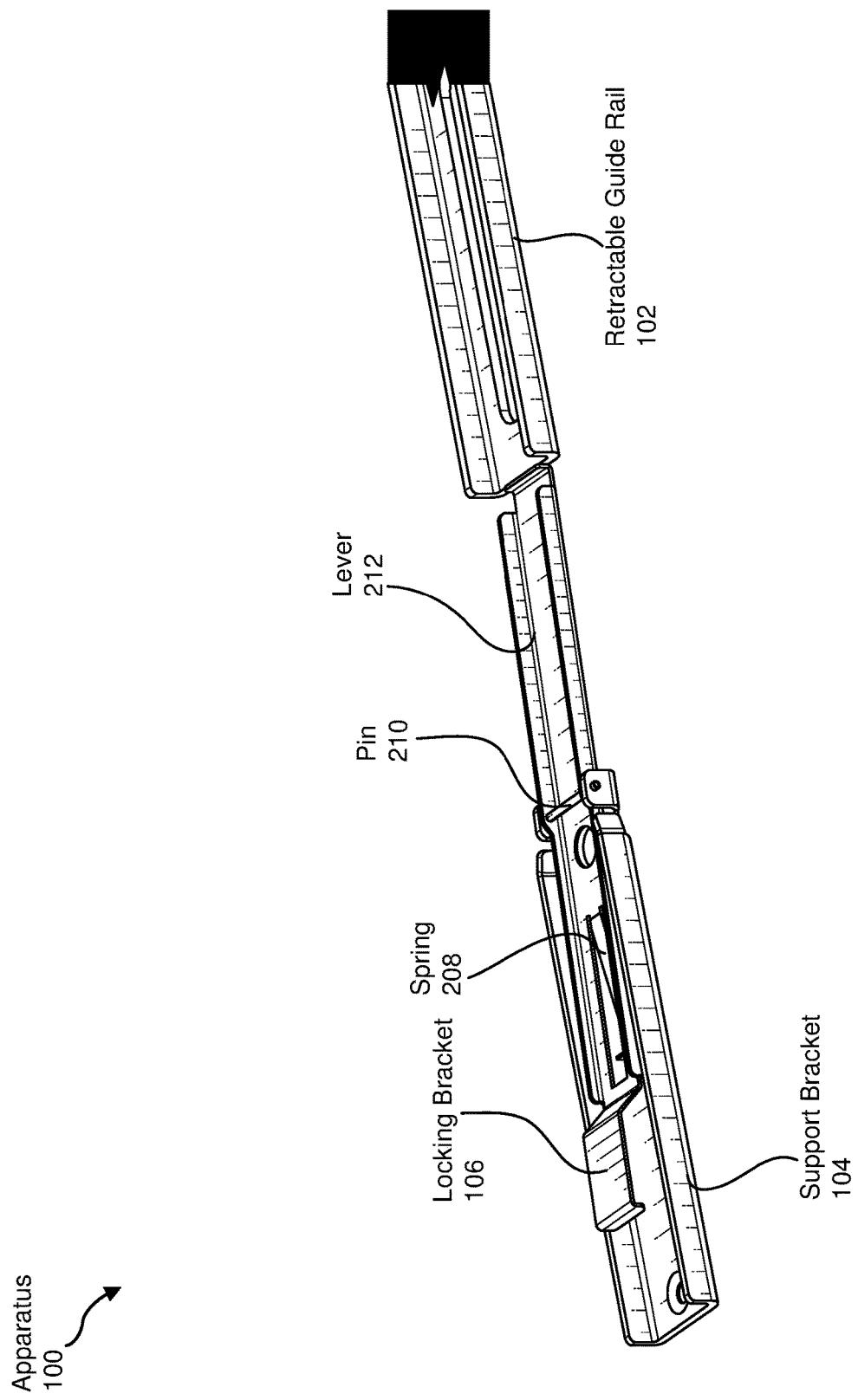
FIG. 2 is an additional illustration of an exemplary apparatus for supporting FRUs in telecommunications devices via retractable guide rails in accordance with one or more embodiments of this disclosure.
Figure 3:
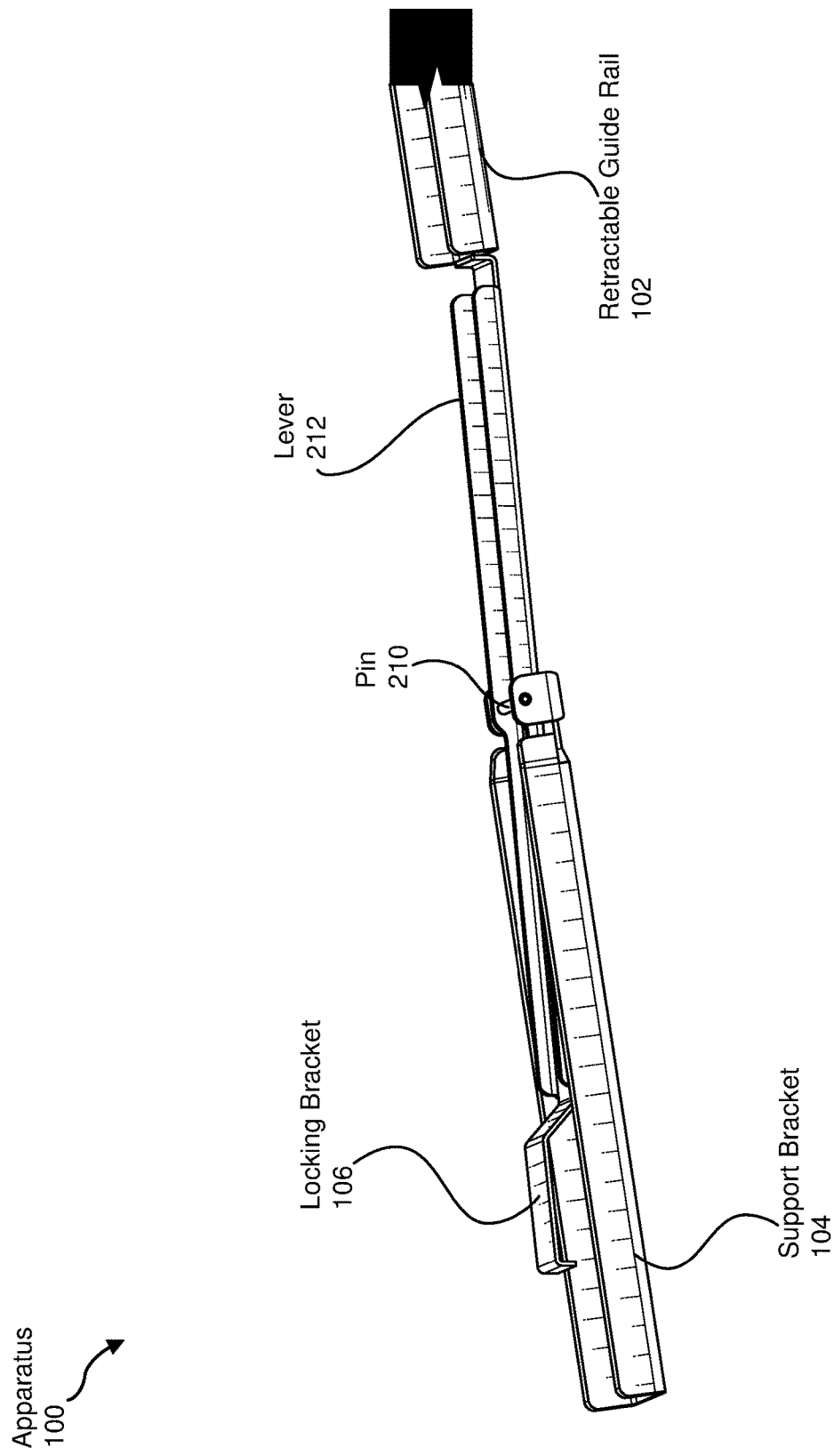
FIG. 3 is an additional illustration of an exemplary apparatus for supporting FRUs in telecommunications devices via retractable guide rails in accordance with one or more embodiments of this disclosure.
Figure 4:
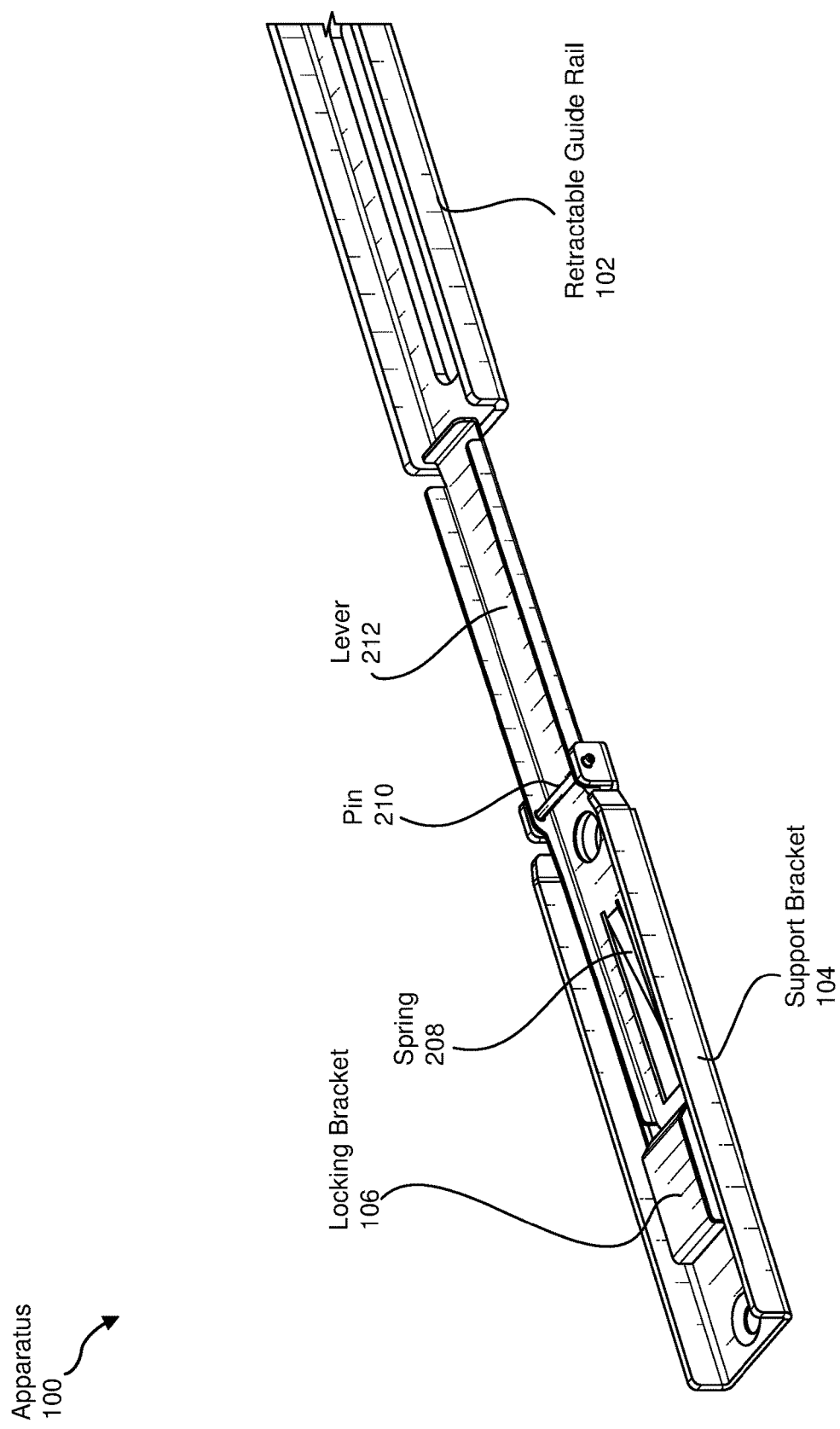
FIG. 4 is an additional illustration of an exemplary apparatus for supporting FRUs in telecommunications devices via retractable guide rails in accordance with one or more embodiments of this disclosure.
Figure 5:
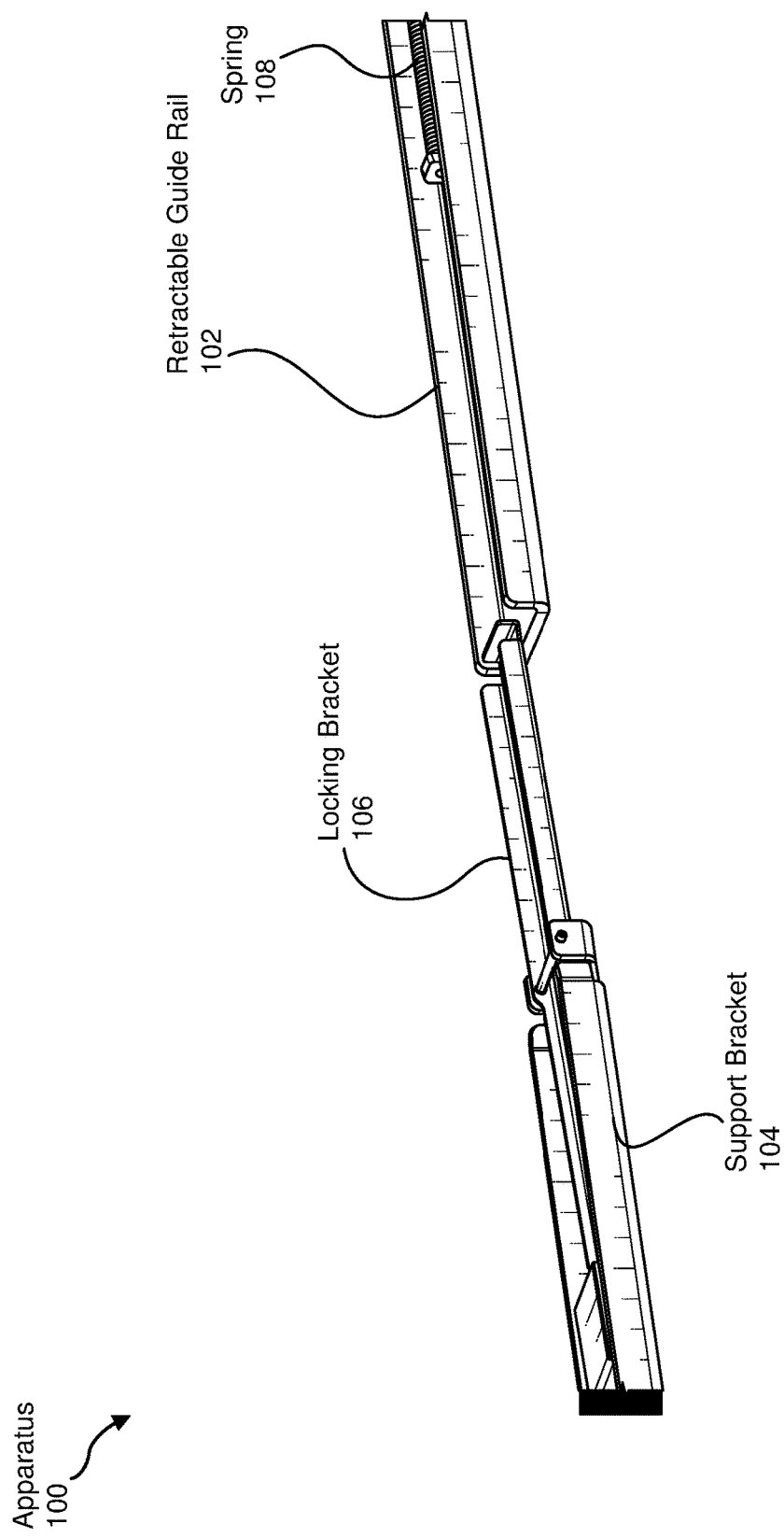
FIG. 5 is an additional illustration of an exemplary apparatus for supporting FRUs in telecommunications devices via retractable guide rails in accordance with one or more embodiments of this disclosure.

As illustrated in at least one of FIGS. 2-4, locking bracket 106 may include and/or incorporate a pin 210, a lever 212, and/or a spring 208, In some examples, pin 210 may couple and/or attach lever 212 to support bracket 104. In such examples, spring 208 may extend and/or project from lever 212, Additionally or alternatively, spring 208 may press and/or rest against a wall of the chassis. Accordingly, locking bracket 106 may be spring-loaded.

In some examples, lever 212 may be configured, assembled, and/or designed to pivot, seesaw, and/or move about or around pin 210. For example, when an FRU is installed and/or inserted in a slot configured with apparatus 100, the FRU may depress the backend of locking bracket 106, thus causing lever 212 to pivot, seesaw, and/or move about pin 210 to disengage retractable guide rail 102. The FRU's depression may compress and/or load spring 208. When lever 212 disengages retractable guide rail 102, spring 110 may cause retractable guide rail 102 to retract and/or collapse into support bracket 104 in the retracted position. In other words, when lever 212 disengages retractable guide rail 102, spring 110 may draw retractable guide rail 102 back to abut support bracket 104.

Additionally or alternatively, when an FRU is uninstalled and/or removed from a slot configured with apparatus 100, the FRU may release the backend of locking bracket 106 and/or draw or pull out retractable guide rail 102 into the expanded position. The FRU's release of the backend of locking bracket 106 may launch, unload, and/or decompress spring 208, thus causing lever 212 to pivot, seesaw, and/or move about pin 210 to engage retractable guide rail 102 once drawn and/or pulled out to the expanded position. When lever 212 engages retractable guide rail 102, retractable guide rail 102 may be held and/or maintained at a certain distance from support bracket 104 in the extended position. In other words, when lever 212 engages retractable guide rail 102, retractable guide rail 102 may prevent retractable guide rail 102 from retracting and/or collapsing into support bracket 104.

Springs 110 and 208 may each include and/or represent any type or form of spring mechanism and/or device that serves a suitable purpose. In one example, spring 110 may include and/or represent a tension spring designed to extend and/or expand retractable guide rail 102 when no FRU is installed. Additionally or alternatively, spring 208 may include and/or represent a flat and/or compression spring designed to push and/or keep lever 212 away from the chassis wall when no FRU is installed. Examples of springs 110 and 208 include, without limitation, coil springs, tension springs, extension springs, horseshoe springs, torsion springs, compression springs, flat springs, constant-force springs, gas springs, combinations or variations of one or more of the same, and/or any other suitable springs.

Figure 6:
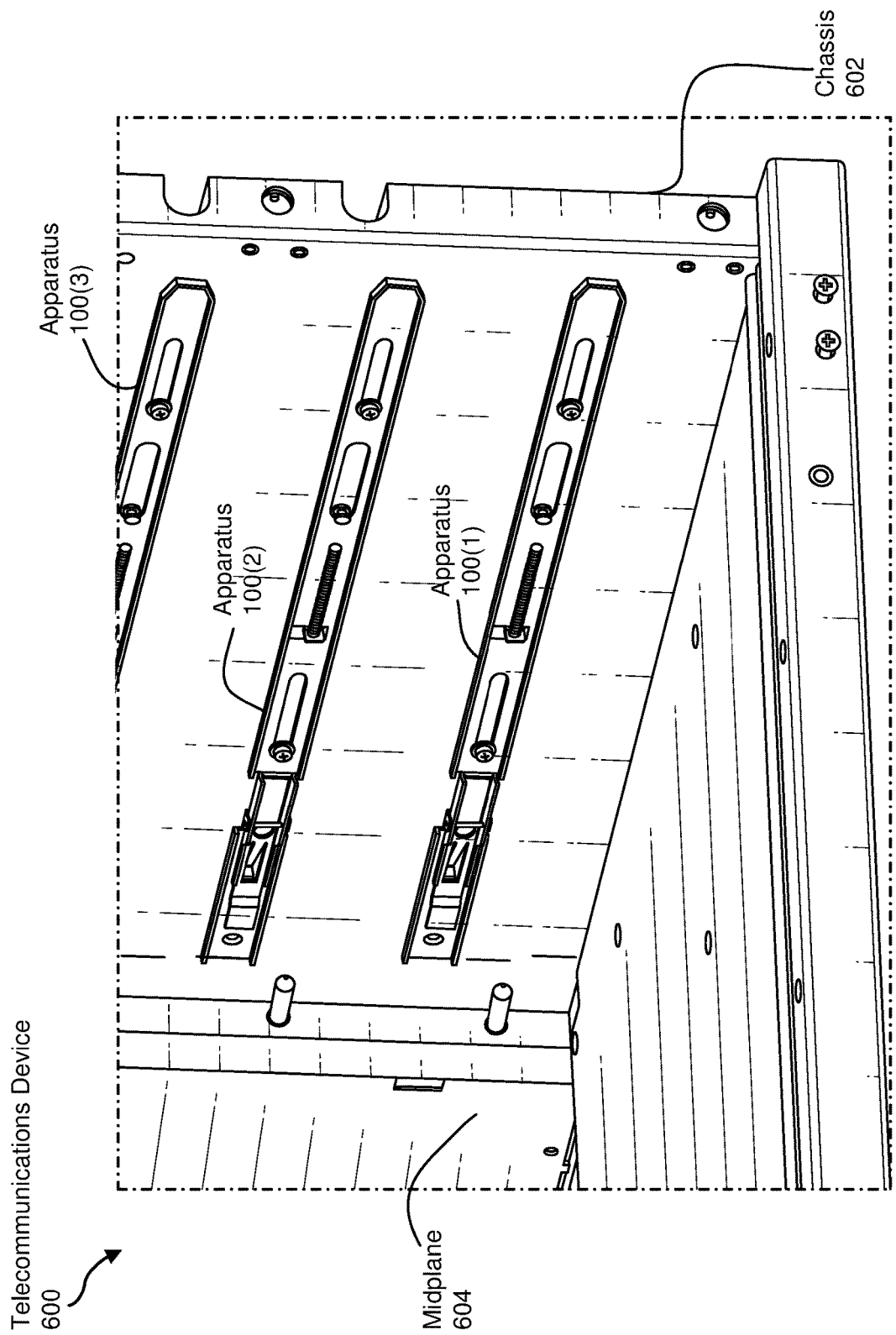
FIG. 6 is an illustration of an exemplary telecommunications device that includes retractable guide rails for supporting FRUS in accordance with one or more embodiments of this disclosure.

FIG. 6 illustrates an exemplary telecommunications device 600 that includes and/or represents a chassis 602, a midplane 604, and/or apparatuses 100(1), 100(2), and 100(3). As illustrated in FIG. 6, apparatuses 100(1)-(3) may be coupled to and/or installed in chassis 602 by standoffs and/or screws. In some examples, apparatuses 100(1)-(3) may be configured and/or arranged to support and/or sustain three different FRUs within chassis 602. In such examples, counterpart apparatuses (not illustrated in FIG. 6) may be configured and/or arranged on the side opposite apparatuses 100(1)-(3) within chassis 602. Each of apparatuses 100(1)-(3) may include and/or represent any of the components, pieces, and/or mechanisms described above in connection with FIGS. 1-5.

In some examples, midplane 604 may be configured and/or installed in chassis 602, In one example, when an FRU is installed and/or inserted into a slot equipped with one of apparatuses 100(1)-(3), the FRU may depress the backend of the corresponding locking bracket, thus causing the corresponding lever to pivot, seesaw, and/or move to disengage the retractable guide rail. Since, in this example, the lever disengages the retractable guide rail, the retractable guide rail may retract and/or collapse toward the corresponding support bracket into the retracted position. In the retracted position, the retractable guide rail may abut the support bracket to enable the FRU to interface with and/or connect to midplane 604. In contrast, when an FRU is uninstalled and/or removed from a slot equipped with one of apparatuses 100(1)-(3), the FRU may release the backend of locking bracket 106 and/or draw or pull out retractable guide rail 102 into the expanded position.

In some examples, telecommunications device 600 may include and/or represent a router (such as a provider edge router, hub router, spoke router, autonomous system boundary router, and/or area border router) that receives, routes, forwards, and/or otherwise handles network traffic. Additional examples of telecommunications device 600 include, without limitation, switches, hubs, modems, bridges, repeaters, gateways, multiplexers, network adapters, network interfaces, client devices, desktops, servers, variations or combinations of one or more of the same, and/or any other suitable telecommunications device.

Figure 7:
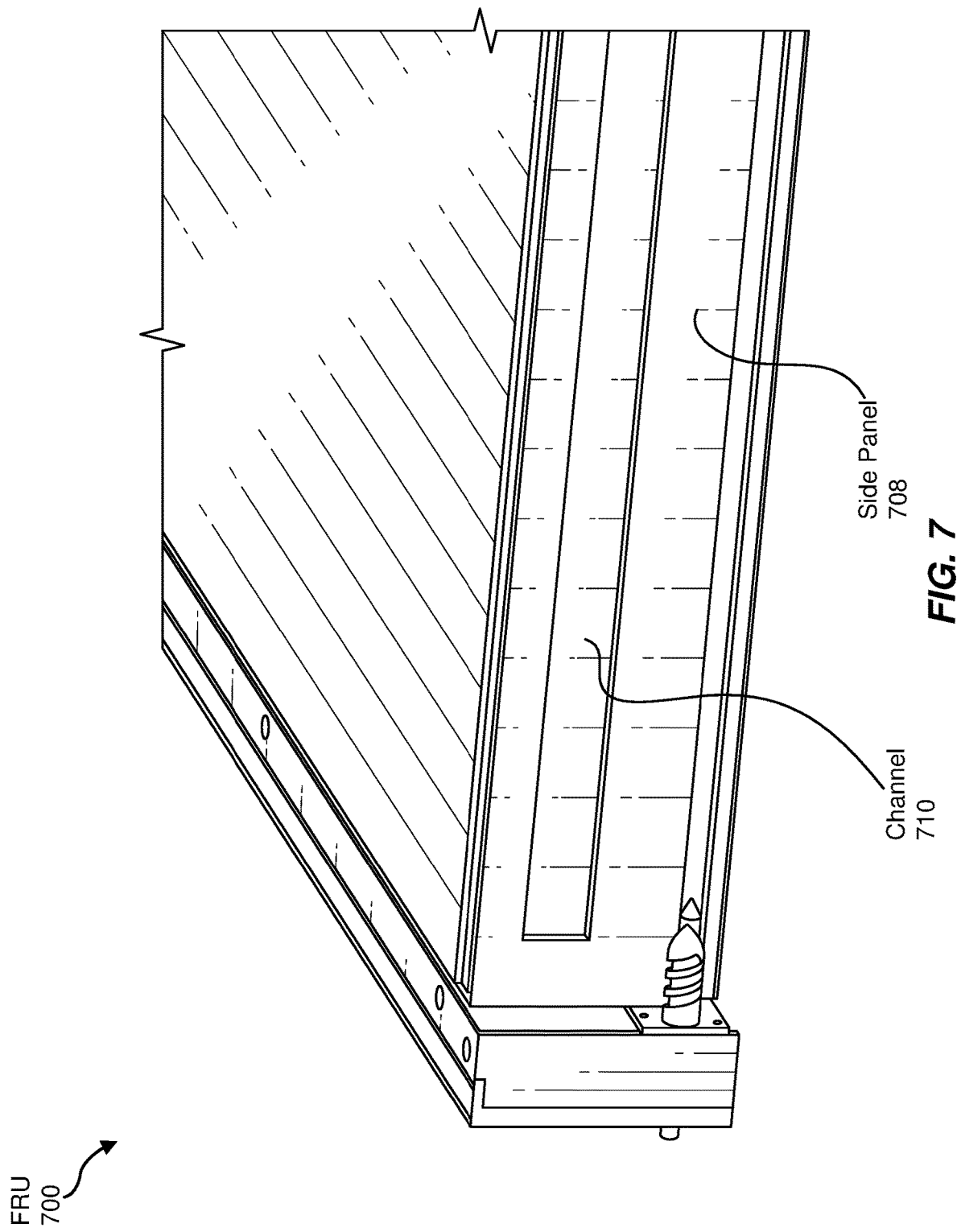
FIG. 7 is an illustration of an exemplary FRU in accordance with one or more embodiments of this disclosure.

FIG. 7 illustrates an exemplary FRU 700 capable of being installed and/or inserted into a slot of telecommunications device 600 in FIG. 6. As illustrated in FIG. 7, exemplary FRU 700 may include and/or represent a side panel 708. In some examples, side panel 708 may include and/or form a channel 710 that interfaces and/or mates with the retractable guide rail of one of apparatuses 100(1)-(3) in FIG. 6, In such examples, the retractable guide rail may apply, impart, and/or transmit a force on channel 710 to support FRU 700 upon being installed and/or inserted into the slot of telecommunications device 600.

In some examples, side panel 708 may contact and/or depress the locking bracket of one of apparatuses 100(1)-(3) in FIG. 6. For example, the bottom of channel 710 may make contact with the locking bracket of one of apparatuses 100(1)-(3), thereby depressing that locking bracket. By doing so, side panel 708 and/or the bottom of channel 710 may cause the locking bracket to disengage the corresponding retractable guide rail, thereby causing and/or enabling the retractable guide rail to move and/or collapse to the retracted position. Examples of FRU 700 include, without limitation, line cards, Physical Interface Cards (PICs), Flexible PIC Concentrators (FPCs), Switch Interface Boards (SIBS), control boards, routing engines, packet forwarding engines, fan trays, connector interface panels, portions of one or more of the same, combinations or variations of one or more of the same, and/or any other suitable FRUs.

Figure 8:
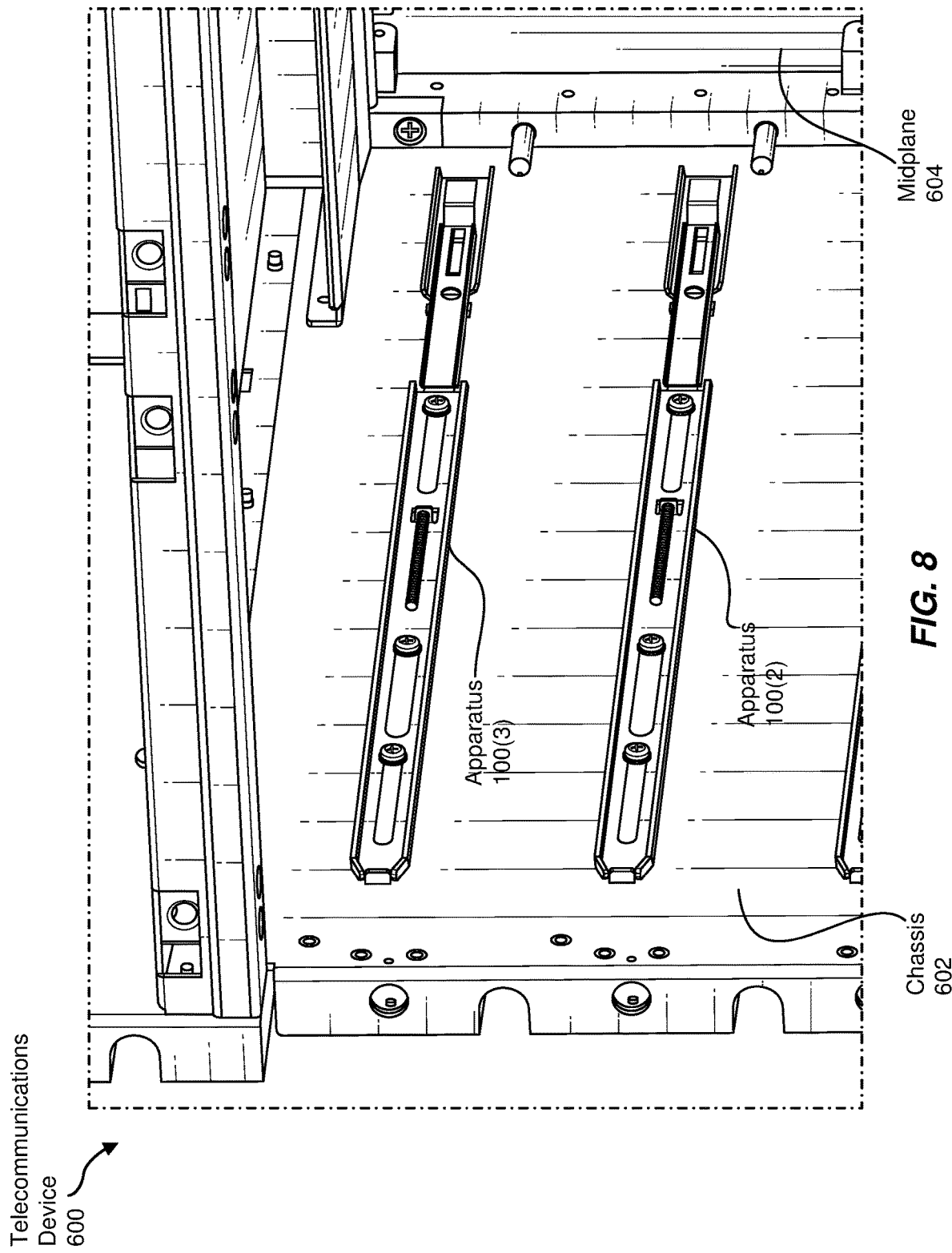
FIG. 8 is an additional illustration of an exemplary telecommunications device that includes retractable guide rails for supporting FRUS in accordance with one or more embodiments of this disclosure.

FIG. 8 illustrates another view of exemplary telecommunications device 600 that includes and/or represents chassis 602, midplane 604, and/or apparatuses 100(1)-(3). As illustrated in FIG. 8, the apparatuses may be coupled to and/or installed in chassis 602 to support and/or sustain three different FRUs. Each of these apparatuses may include and/or represent any of the components, pieces, and/or mechanisms described above in connection with FIGS. 1-6.

Figure 9:
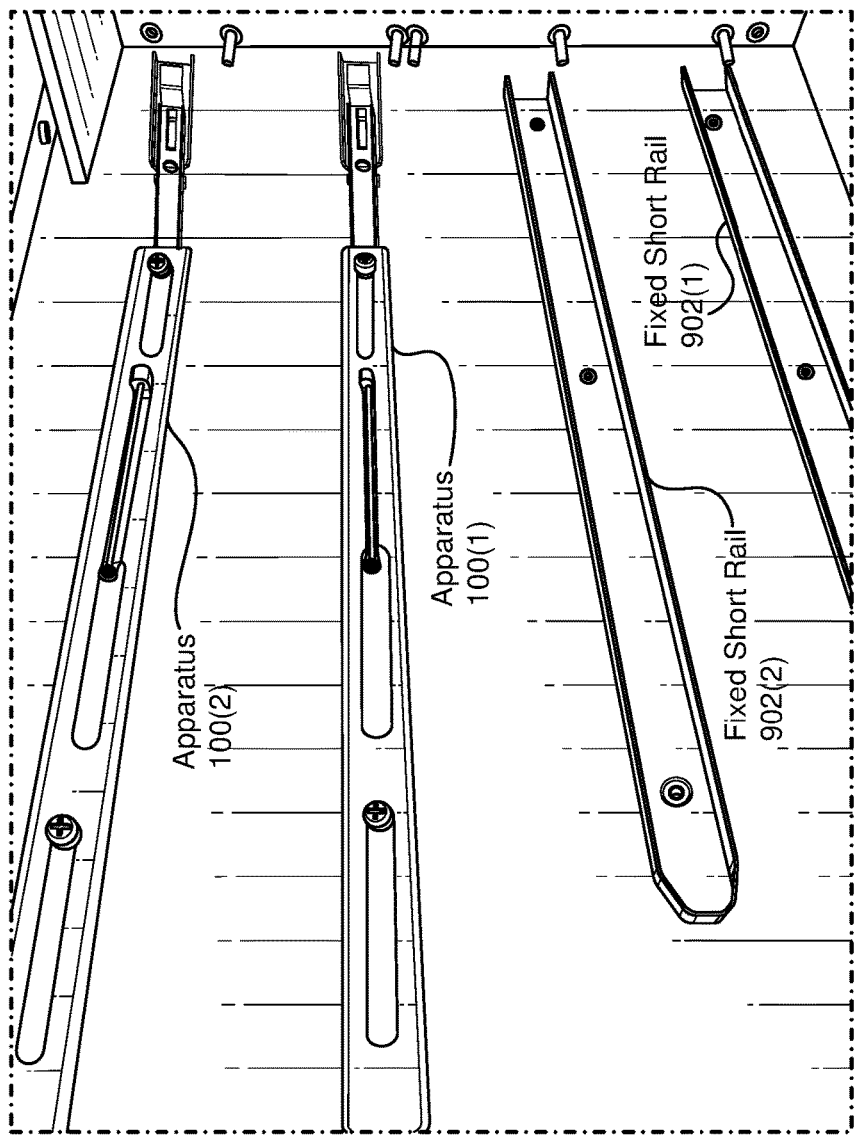
FIG. 9 is an illustration of an exemplary chassis that includes retractable guide rails for supporting FRUS in accordance with one or more embodiments of this disclosure.

FIG. 9 illustrates an exemplary chassis 602 in which apparatuses 100(1) and 100(2) and fixed short rails 902(1) and 902(2) are installed. As illustrated in FIG. 9, the apparatuses 100(1) and 100(2) may be intermixed and/or comingled with fixed short rails 902(1) and 902(2) in chassis 602, However, unlike fixed short rails 902(1) and 902(2), apparatuses 100(1) and 100(2) may provide certain support benefits to an administrator and/or technician who installs and/or uninstalls FRUs. For example, apparatuses 100(1) and 100(2) may help the administrator and/or technician install and/or uninstall FRUs within chassis 602 by easing and/or alleviating his or her physical burden (e.g., when aligning the shortened support channels on FRU side panels during installation and/or when assuming the weight of the FRUs during uninstallation).

Figure 10:
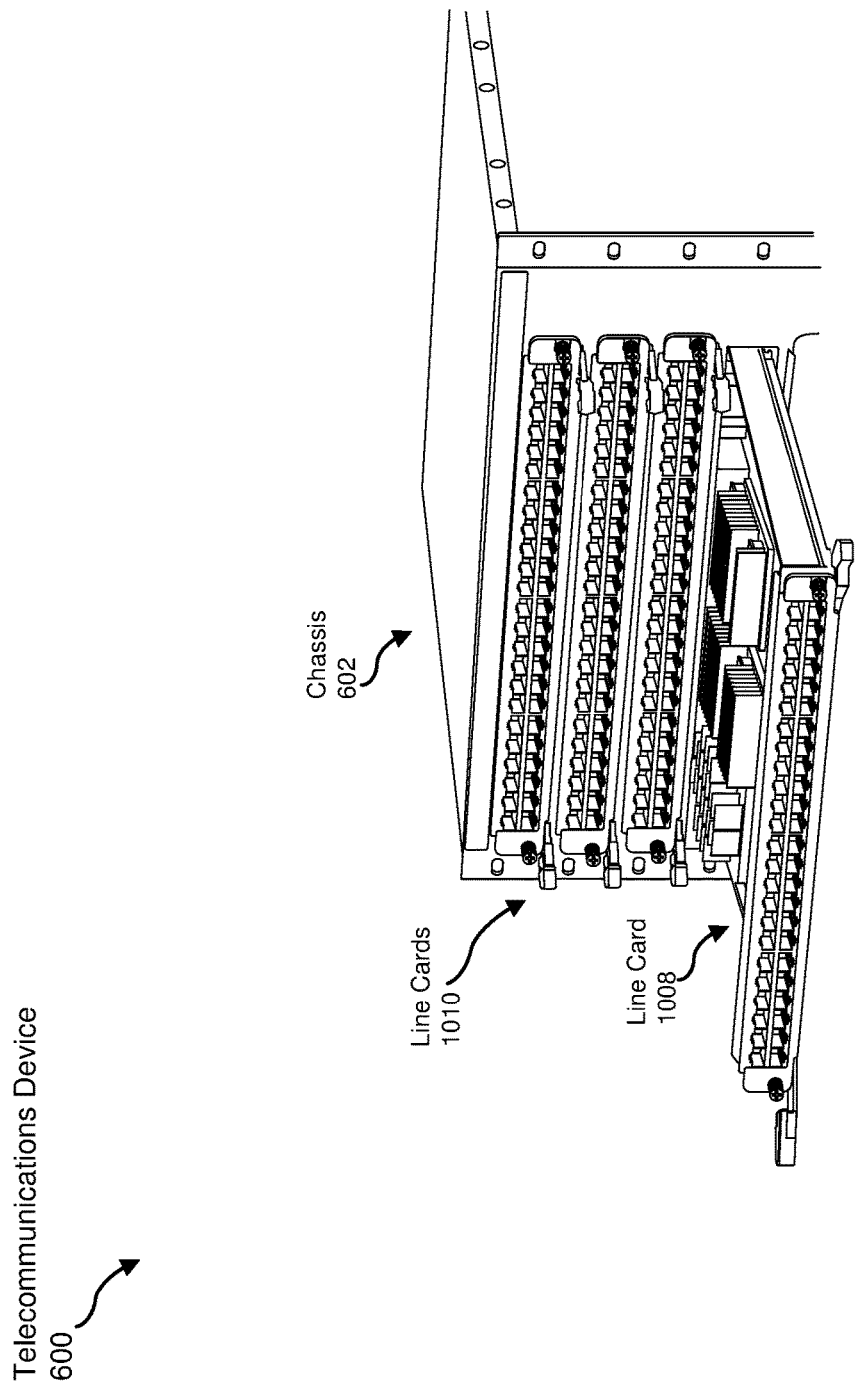
FIG. 10 is an additional illustration of an exemplary telecommunications device that includes retractable guide rails for supporting FRUS in accordance with one or more embodiments of this disclosure.

FIG. 10 illustrates an exemplary telecommunications device 600 that includes and/or represents chassis 602, line cards 1010, and a line card 1008, As illustrated in FIG. 10, line cards 1010 may be installed and/or inserted into different slots of chassis 602. In some examples, because line cards 1010 are installed and/or inserted into those slots of chassis 602, the retractable guide rails applied to those slots may be collapsed into the retracted position. In contrast, line card 1008 may be uninstalled and/or not fully installed into its slot of chassis 602. Accordingly, because line card 1008 is not fully installed into its slot of chassis 602, the retractable guide rails applied to that slot may be lengthened into the expanded position.

Figure 11:
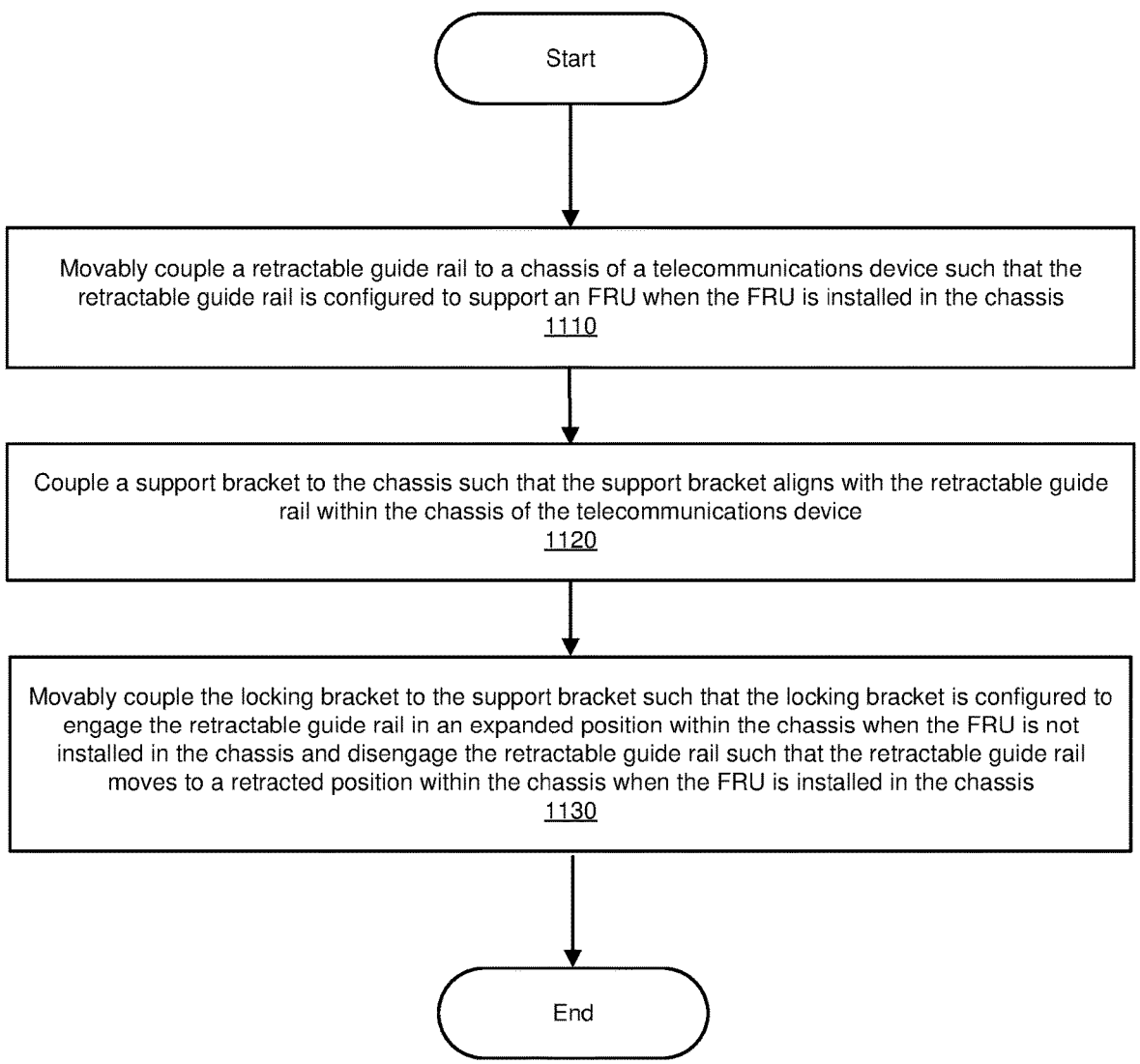
FIG. 11 is a flow diagram of an exemplary method for assembling an apparatus for supporting FRUs in telecommunications devices in accordance with one or more embodiments of this disclosure.

FIG. 11 is a flow diagram of an exemplary method 1100 for assembling and/or manufacturing an apparatus for supporting FRUs in telecommunications devices. Method 1100 may include the step of (1110). Step 1110 may be performed in a variety of ways, including any of those described above in connection with FIGS. 1-10. For example, a computing equipment manufacturer or subcontractor may movably couple and/or attach a retractable guide rail to a chassis of a telecommunications device such that the retractable guide rail is configured to support an FRU when the FRU is installed in the chassis.

Method 1100 may also include the step of coupling a support bracket to the chassis such that the support bracket aligns with the retractable guide rail within the chassis of the telecommunications device (1120). Step 1120 may be performed in a variety of ways, including any of those described above in connection with FIGS. 1-10, For example, the computing equipment manufacturer or subcontractor may couple and/or fix a support bracket to the chassis such that the support bracket aligns with the retractable guide rail within the chassis of the telecommunications device.

Method 1100 may also include the step of movably coupling a locking bracket to the support bracket such that the locking bracket is configured to engage the retractable guide rail in the expanded position when the FRU is not installed and disengage the retractable guide rail such that the retractable guide rail moves to a retracted position when the FRU is installed (1130). Step 1130 may be performed in a variety of ways, including any of those described above in conn ion with FIGS. 1-10. For example, the computing equipment manufacturer or subcontractor may movably coupling and/or attach a locking bracket to the support bracket such that the locking bracket is configured to engage the retractable guide rail in the expanded position when the FRU is not installed and disengage the retractable guide rail such that the retractable guide rail moves to a retracted position when the FRU is installed.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of," Finally, for ease of use, the terms "including" and "having" (and their derivatives), as used in the specification and claims, are interchangeable with and have the same meaning as the word "comprising."

What is claimed is:

1. An apparatus comprising:
    a retractable guide rail movably coupled to an internal wall of a chassis, wherein the retractable guide rail is configured to support a field-replaceable unit when the field-replaceable unit is installed in the chassis;
    a support bracket fixed to the internal wall of the chassis and aligned with the retractable guide rail within the chassis; and
    a locking bracket movably coupled to the support bracket, wherein the locking bracket is configured to:
        engage the retractable guide rail in an expanded position along the internal wall of the chassis when the field-replaceable unit is not installed in the chassis, wherein the support bracket includes a spring that is coupled to the locking bracket and causes the locking bracket to engage the retractable guide rail in the expanded position when the field-replaceable unit is not installed in the chassis; and
        disengage the retractable guide rail as the field-replaceable unit depresses the locking bracket during installation in the chassis such that the retractable guide rail moves to a retracted position along the internal wall of the chassis.

2. The apparatus of claim 1, further comprising one or more standoffs that movably couple the retractable guide rail to the chassis; and
    wherein the retractable guide rail comprises one or more slots through which the standoffs pass to movably couple the retractable guide rail to the chassis.

3. The apparatus of claim 2, further comprising an additional spring coupled between the retractable guide rail and the chassis or an extension of the chassis, wherein the additional spring is configured to move the retractable guide rail to the expanded position when the field-replaceable unit is not installed.

4. The apparatus of claim 3, wherein the field-replaceable unit comprises a side panel that:
    includes a channel that interfaces with the retractable guide rail coupled to the chassis to support the field-replaceable unit; and
    depresses the locking bracket to disengage the retractable guide rail and enables the retractable guide rail to move to the retracted position.

5. The apparatus of claim 3, wherein the extension of the chassis comprises one of the standoffs that movably couple the retractable guide rail to the chassis.

6. The apparatus of claim 2, wherein the slots define a distance that the retractable guide rail is able to move between the expandable position and the retractable position.

7. The apparatus of claim 1, wherein the locking bracket includes a pin and a lever, the lever being configured to pivot about the pin when the locking bracket is engaged or disengaged by the field-replaceable unit.

8. The apparatus of claim 1, wherein the expanded position involves the retractable guide rail being positioned toward a front side of the chassis to support the field-replaceable unit for installation into the chassis.

9. The apparatus of claim 1, wherein the retracted position involves the retractable guide rail abutting the support bracket to enable to the field-replaceable unit to interface with a midplane of the chassis.

10. A telecommunications device comprising:
    a chassis;
    a retractable guide rail movably coupled to an internal wall of the chassis, wherein the retractable guide rail is configured to support a field-replaceable unit when the field-replaceable unit is installed in the chassis;

a support bracket fixed to the internal wall of the chassis and aligned with the retractable guide rail within the chassis; and a locking bracket movably coupled to the support bracket, wherein the locking bracket is configured to:

engage the retractable guide rail in an expanded position along the internal wall of the chassis when the field-replaceable unit is not installed in the chassis, wherein the support bracket includes a spring that is coupled to the locking bracket and causes the locking bracket to engage the retractable guide rail in the expanded position when the field-replaceable unit is not installed in the chassis; and disengage the retractable guide rail as the field-replaceable unit depresses the locking bracket during installation in the chassis such that the retractable guide rail moves to a retracted position along the internal wall of the chassis.

11. The telecommunications device of claim 10, further comprising one or more standoffs that movably couple the retractable guide rail to the chassis; and wherein the retractable guide rail comprises one or more slots through which the standoffs pass to movably couple the retractable guide rail to the chassis.

12. The telecommunications device of claim 11, further comprising an additional spring coupled between the retractable guide rail and the chassis or an extension of the chassis, wherein the additional spring is configured to move the retractable guide rail to an expanded position when the field-replaceable unit is not installed.

13. The telecommunications device of claim 12, wherein the field-replaceable unit comprises a side panel that:

includes a channel that interfaces with the retractable guide rail coupled to the chassis to support the field-replaceable unit; and depresses the locking bracket to disengage the retractable guide rail and enables the retractable guide rail to move to the retracted position.

14. The telecommunications device of claim 12, wherein the extension of the chassis comprises one of the standoffs that movably couple the retractable guide rail to the chassis.

15. The telecommunications device of claim 11, wherein the slots define a distance that the retractable guide rail is able to move between the expandable position and the retractable position.

16. A method comprising:

movably coupling a retractable guide rail to an internal wall of a chassis of a telecommunications device such that the retractable guide rail is configured to support a field-replaceable unit when the field-replaceable unit is installed in the chassis;

fixing a support bracket to the internal wall of the chassis such that the support bracket aligns with the retractable guide rail within the chassis of the telecommunications device; and movably coupling a locking bracket to the support bracket such that the locking bracket is configured to:

engage the retractable guide rail in an expanded position along the internal wall of the chassis when the field-replaceable unit is not installed in the chassis, wherein the support bracket includes a spring that is coupled to the locking bracket and causes the locking bracket to engage the retractable guide rail in the expanded position when the field-replaceable unit is not installed in the chassis; and disengage the retractable guide rail as the field-replaceable unit depresses the locking bracket during installation in the chassis such that the retractable guide rail moves to a retracted position along the internal wall of the chassis.

* * * * *